United States Patent [19]

Erhardt

[11] Patent Number: 4,910,569

[45] Date of Patent: Mar. 20, 1990

[54] CHARGE-COUPLED DEVICE HAVING IMPROVED TRANSFER EFFICIENCY

[75] Inventor: Herbert J. Erhardt, Rochester, N.Y.

[73] Assignee: Eastman Kodak Company, Rochester, N.Y.

[21] Appl. No.: 237,029

[22] Filed: Aug. 29, 1988

[51] Int. Cl.⁴ .................. H01L 29/78; G11C 19/28
[52] U.S. Cl. ................................. 357/24; 377/58
[58] Field of Search .................. 357/24; 377/57-63

[56] References Cited

U.S. PATENT DOCUMENTS

| Re. 30,917 | 4/1982 | Hagiwara et al. | 357/24 |
| 3,767,983 | 10/1973 | Berglund | 357/24 |
| 3,796,932 | 3/1974 | Amelio et al. | 357/24 M |
| 3,906,542 | 9/1975 | Krambeck et al. | 357/24 |
| 4,148,132 | 4/1979 | Bower | 29/571 |
| 4,179,793 | 12/1979 | Hagiwara | 29/578 |
| 4,215,357 | 7/1980 | Kohyama et al. | 357/24 |
| 4,613,402 | 9/1986 | Losee et al. | 156/643 |

Primary Examiner—Gene M. Munson
Attorney, Agent, or Firm—Donald D. Schaper

[57] ABSTRACT

A charge-coupled device (CCD) of the two-phase type is disclosed. The CCD comprises two polysilicon levels which are electrically connected to form one clock phase. In order to provide a CCD of improved transfer efficiency, two implanted regions of different dopant levels are provided under each polysilicon level. When the CCD is clocked, a four-tier potential profile is produced.

10 Claims, 3 Drawing Sheets

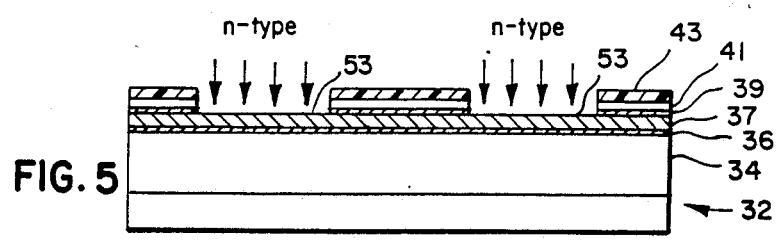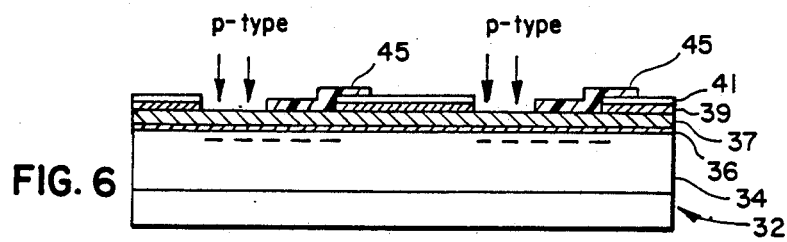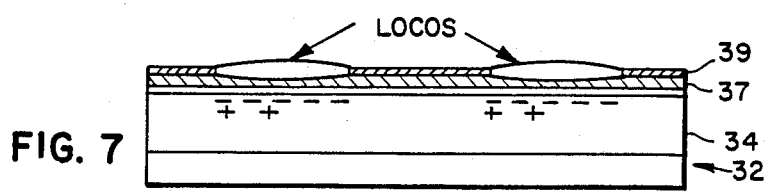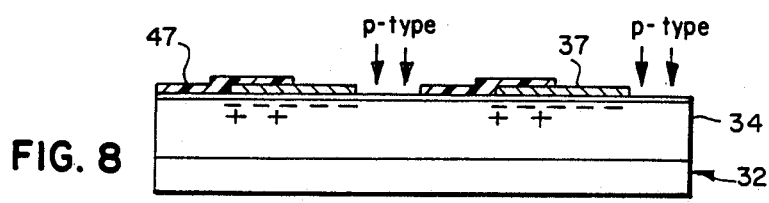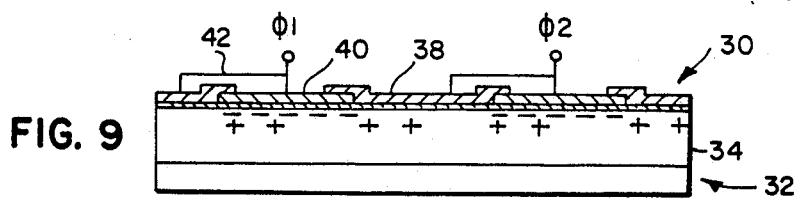

CHARGE-COUPLED DEVICE HAVING IMPROVED TRANSFER EFFICIENCY

BACKGROUND OF THE INVENTION

1. Field of the Invention

The present invention relates to a charge-coupled device (CCD), and more particularly, to such a device which has improved transfer efficiency.

2. State of the Prior Art

It is known in two-phase CCD devices to employ either a true two-phase structure with two distinct potential levels under a single gate electrode or a pseudo two-phase structure in which there is a uniform, but distinct, potential level under each of two electrically-connected gate electrodes which form one clock phase. In applications involving long device cells and in high-speed applications, the transfer efficiency of these conventional structures is not entirely satisfactory. Thus, ways have been sought to improve the transfer efficiency in CCD's while at the same time not unduly complicating the process of making the device.

U.S. Pat. No. 3,767,983, is directed to improving the transfer efficiency in a charge transfer device of the bucket brigade type. The device disclosed in this patent includes two different threshold voltages in the transfer region between each pair of successive storage sites. There is a substantially abrupt transition between the two different threshold voltages in the transfer region. The abrupt transition is provided to improve the transfer efficiency of the device by solving the problem of feedback voltage which occurs between the transferor zone (source) and the transferee zone (drain). Such a problem does not exist in CCD'however,.and thus, this patent does not provide a solution to the problem of increasing the transfer efficiency in a CCD.

SUMMARY OF THE INVENTION

It is an object of the present invention to overcome the problems in the prior art discussed above and to provide an improved CCD.

In accordance with one aspect of the invention, there is provided a charge-coupled device for storage and transfer in a predetermined direction of varying amounts of mobile charge carriers, the device having a plurality of phases, the device comprising: a substrate of a first conductivity type; a layer of a second conductivity type on the substrate; an insulating layer on the layer of a second conductivity type; electrode means for each phase of said device, said electrode means including at least one gate electrode on said insulating layers, a plurality of the electrode means being disposed to form a path in the predetermined direction; and at least three implanted regions of different dopant levels under each of the electrode means.

In one embodiment of the present invention, two polysilicon levels are used for each clock phase of a two-phase CCD. The polysilicon levels are electrically connected to form the gate electrodes of one phase of the device, and two dopant levels are provided under each polysilicon level. When the CCD is clocked, a four-tier potential profile is produced beneath each phase.

The CCD of the present invention has a very high transfer efficiency, and thus, it is particularly suitable for use in high speed applications and in devices having relatively long cells. The high transfer efficiency results from the multiple potential levels and the resulting increased electric fields which are formed when the CCD is being clocked. A further advantage of the present invention is the method disclosed herein of making a CCD in which two levels of polysilicon are used in a manner to minimize the number of mask steps and provide self-aligned profiles. In the practice of this method, the effective number of potential steps per phase in a CCD can be doubled with only one additional implant.

Other features and advantages will become apparent with reference to the following Description of the Preferred Embodiment when read in light of the attached drawings.

BRIEF DESCRIPTION OF THE DRAWINGS

FIGS. 5–9 show the steps performed in making the CCD of the present invention;

DESCRIPTION OF THE PREFERRED EMBODIMENT

Figure 1:
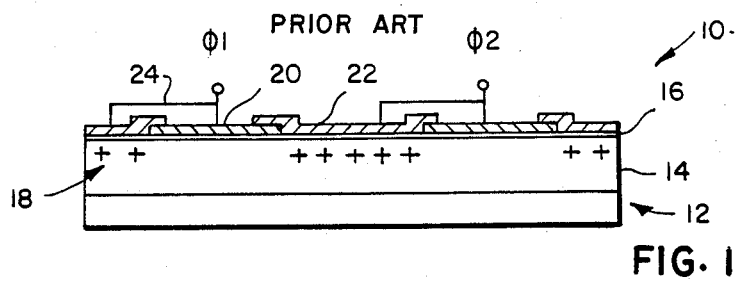
FIG. 1 is a sectional view of a prior-art CCD of the pseudo two-phase type.

With reference to FIG. 1, there is shown a prior-art CCD which is designated 10. CCD 10 is of the pseudo two-phase type, and comprises a P-type substrate 12. A N-type buried channel 14 is formed in substrate 12, and an insulating layer 16 is formed over buried channel 14. P-type implants are made as shown at 18, and polysilicon gate electrodes 20 and 22 are formed on layer 16. Electrodes 20 and 22 are electrically connected by a conductor 24 to form either phase one ($\phi 1$) or phase two ($\phi 2$) of the device 10.

Figure 2:
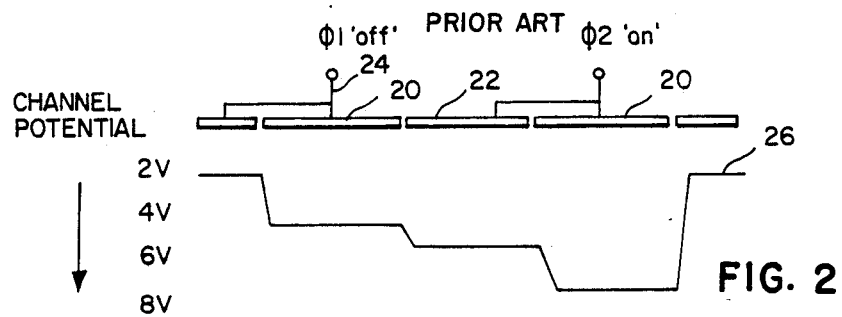
FIG. 2 is a potential profile of the CCD shown in FIG. 1.
Figure 10:
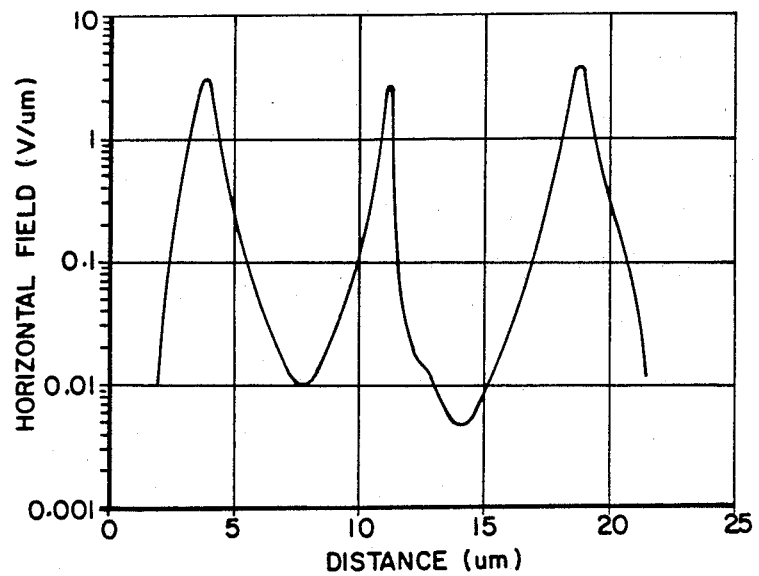
FIG. 10 is a graph showing horizontal field versus cell length for a conventional two-phase CCD.

A potential diagram of prior-art device 10 is shown in FIG. 2 in which electrodes 20 and 22 are indicated schematically. As shown in FIG. 2, the resulting potential profile 26 of device 10 when it is being clocked is a two-tier profile in which, for example, tiers at 2V and 4V occur in a phase which is turned off and tiers at 6V and 8V occur when a phase is turned on. The two tiers for each phase are required for uni-directional charge transfer. A disadvantage of the device 10 is that the electric field across the cell, as illustrated by the diagram in FIG. 10, is less than adequate for charge transfer in long device cell applications and for high-speed applications.

Figure 3:
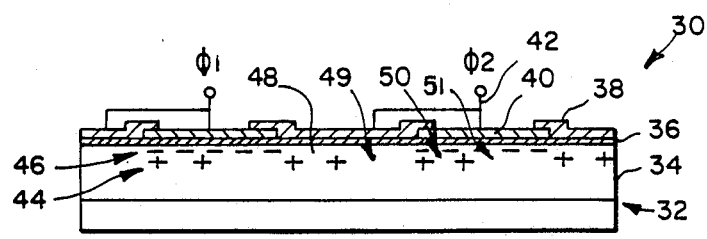
FIG. 3 is a sectional view of the CCD of the present invention.

A CCD 30 which is constructed in accordance with the present invention is shown in FIG. 3. CCD 30 is a two-phase device and comprises a P-type substrate 32 having a N-type buried channel 34 formed therein. A gate oxide 36 is formed over the buried channel 34, and polysilicon gate electrodes 38 and 40 are formed on oxide 36. Electrodes 38 and 40 are electrically connected by a conductor 42 to form either $\phi 1$ or $\phi 2$ of device 30. As shown in FIG. 3, electrodes 38 and 40 have different levels of polysilicon; electrode 40 is generally planar, and electrode 38 is formed with portions which overlap adjacent electrodes 40.

As noted above, two polysilicon levels are used for each phase in device 30. It is also a feature of the present invention to provide two implanted regions of different dopant levels under each electrode 38, 40, such that there are two potentials formed under each polysilicon level. Thus, as shown in FIG. 3, a P-type implant 44 is made under each of the electrodes 38, 40, and an N-type implant 46 is made under each of the electrodes 40. As a result of implants 44 and 46, there are formed under electrodes 38 and 40 a first region 48 having a P-type implant in the N-type buried channel 34, a second region 49 having no implant in the buried channel 34, a third region 50 having a P-type implant and an N-type implant in the buried channel 34, and a fourth region 51 having an N-type implant in the buried channel 34.

Figure 4:
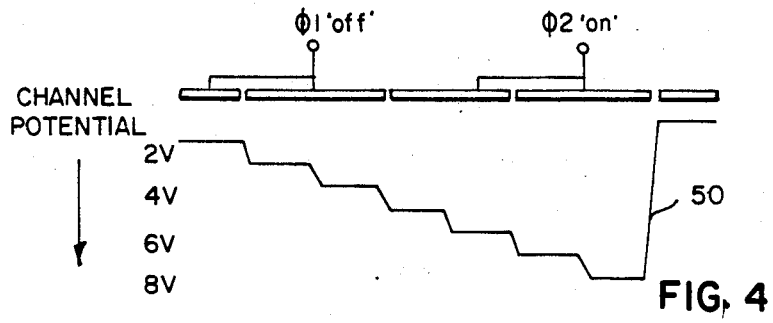
FIG. 4 is a potential profile of the CCD shown in FIG. 3.
Figure 11:
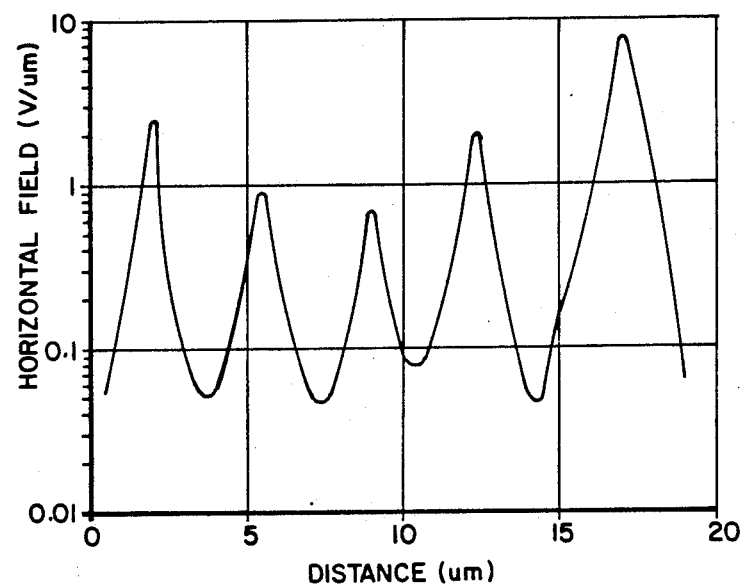
FIG. 11 is a graph showing horizontal field versus cell length for the CCD of the present invention.

A potential diagram for device 30 is shown in FIG. 4, and as can be seen therein, a four-tier potential profile 50 is produced in device 30 when the device 30 is being clocked. As a result of increasing the number of tiers, or steps, under each electrode 38, 40, and thereby increasing the drift field across the cell, as shown in FIG. 11, the transfer efficiency of device 30 is substantially increased. Using two-dimensional electrostatics modeling, the electric field for the CCD structure, under typical operating conditions, can be calculated. The magnitude of this field is shown for a prior-art structure in FIG. 10 and for the structure of the present invention in FIG. 11. The peaks in FIGS. 10 and 11 represent the change from one potential tier to the next; the valleys in these figures show the drop in the field across a given tier. A higher field value speeds-up charge transport. It can be seen in FIG. 11 that there is a greater number of high field peaks and the field value across each tier remains at a higher level than in FIG. 10. The net result is more field-aided transport of charge across the cell resulting in lower transfer times and improved charge transfer efficiency.

A manufacturing process for producing device 30 is shown in FIGS. 5-9. As shown in FIG. 5, the process is carried out using a P-type substrate 32 having an N-type buried channel 34 implanted therein in a known manner. A gate oxide 36 is grown on the substrate 32 over buried channel 34, followed by the deposition of a layer 37 of polysilicon, a layer 39 of silicon nitride, and a layer 41 of silicon dioxide.

As shown in FIG. 5, a first gate electrode area 53 is defined by a photoresist 43, and the silicon nitride layer 39 and the silicon dioxide layer 41 are removed in the areas 53. A N-type material is implanted through the polysilicon 37 and gate oxide 36 in the areas 53. Photoresist 43 is then stripped off, and a photoresist 45 is applied to define the width of a stepped potential region with respect to the edge of a first gate electrode. A P-type implant is then made, as shown in FIG. 6, which provides for the decrease in the channel potential in the stepped potential region. Resist 45 is then stripped off, as well as the remaining deposited oxide, and the exposed polysilicon is locally oxidized by a conventional LOCOS (Local Oxidation of Silicon) process as shown in FIG. 7. The remaining silicon nitride layer 39 is then removed by etching, and the polysilicon layer 37 is removed in the areas not locally oxidized.

As shown in FIG. 8, a photoresist 47 is applied to define the width of a second stepped-potential region with respect to the edge of the first gate electrode. In a next step, a P-type material is implanted to provide for the necessary shift in channel potential in the second stepped-potential region. Resist 47 is then stripped, and a second polysilicon layer is deposited and patterned to form second gate electrodes 38. The two gate electrodes are tied together by conductor 42 so that the electrodes can be simultaneously clocked.

It will be apparent that modifications can be made in the process disclosed herein for making a CCD device without departing from the scope of the present invention. For example, the N-type offset implant (FIG. 5), which is made prior to the implant for the first stepped-potential region, can be replaced with an unmasked P-type implant; this results in a lower offset for the the first gate electrode channel potential and requires that the order of the gate electrodes within the phase be interchanged. Another alternative is to replace the N-type (or P-type) implant, which is made prior to the first stepped-potential implant, with an unmasked implant prior to the deposition of the second layer of polysilicon; this implant can be either N-type or P-type depending on the order of the gate electrodes. It is also possible to substitute either or both P-type stepped-potential implants with N-type implants, which are aligned to the trailing edge (right edge as shown in FIGS. 5-9) of the gate electrode; this modification can be used with any of the above configurations depending on the order the gate electrodes or on implant preference. Further, the process disclosed herein can be extended to processes with more than two layers of polysilicon and/or more than two-phase CCD architectures.

The invention has been described in detail with particular reference to the preferred embodiment thereof, but it will be understood that variations and modifications can be effected within the spirit and scope of the invention.

I claim:

1. A charge-coupled device for storage and transfer in a predetermined direction of varying amounts of mobile charge carriers, said device having a plurality of phases, said device comprising:
    a substrate of a first conductivity type;
    a layer of a second conductivity type on said substrate;
    an insulating layer on said layer of a second conductivity type;
    electrode means for each phase of said device, said electrode means including a pair of gate electrodes on said insulating layer, said pair of gate electrodes being electrically connected together, a plurality of said electrode means being disposed to form a path in said predetermined direction; and
    at least three implanted regions of different dopant levels under each of said electrode means.

2. A charge-coupled device, as defined in claim 1, wherein there are at least two implanted regions of different dopant levels under each of said electrodes.

3. A charge-coupled device for storage and transfer in a predetermined direction of information represented by varying amounts of mobile charge carriers, said device comprising:
    a substrate of a first conductivity type;
    a layer of a second conductivity type on said substrate;
    an insulating layer disposed on said layer of a second conductivity type;
    a plurality of gate electrodes disposed over said insulating layer so as to form a path in said predetermined direction, successive pairs of said electrodes being electrically connected to form one phase of said device, one of the electrodes in each phase being formed for a first level of material and the other electrode being formed of a second level of material; and at least two implanted regions of different dopant levels under each of said electrodes.

4. A charge-coupled device, as defined in claim 3, wherein the dopant level in each of the regions under a pair of electrically-connected electrodes is different whereby a four-tier potential profile is produced by a pair of electrodes.

5. A charge-coupled device, as defined in claim 3, wherein said first conductivity type is a P-type.

6. A charge-coupled device, as defined in claim 3, wherein said second conductivity type is an N-type.

7. A charge-coupled device, as defined in claim 3, wherein said gate electrodes are formed of polysilicon.

8. A charge coupled device, as defined in claim 3, wherein the implanted regions under one of the electrodes in a phase are a first region of N-type and P-type and a second region of N-type.

9. A charge-coupled device, as defined in claim 8, wherein the implanted regions under the other electrodes are one region of N-type and P-type and another region of N-type.

10. A charge-coupled device of the two-phase type, said device comprising:

a semiconductor substrate;

two electrically-connected gate electrodes for each of said phases formed on said substrate, the electrodes in each phase being formed from polysilicon and the polysilicon level of one of the electrodes being different from the level of the other electrode; and said substrate having two regions of different dopant levels under each of said electrodes.

* * * * *